(12) United States Patent
Ding et al.

(10) Patent No.: US 9,543,403 B2
(45) Date of Patent: Jan. 10, 2017

(54) BIPOLAR JUNCTION TRANSISTOR WITH MULTIPLE EMITTER FINGERS

(71) Applicant: GLOBALFOUNDRIES INC., Grand Cayman (KY)

(72) Inventors: Hanyi Ding, Colchester, VT (US); Vibhor Jain, Essex Junction, VT (US); Qizhi Liu, Lexington, MA (US)

(73) Assignee: GLOBALFOUNDRIES Inc., Grand Cayman (KY)

(*) Notice: Subject to any disclaimer, the term of this patent is extended or adjusted under 35 U.S.C. 154(b) by 0 days.

(21) Appl. No.: 14/601,655

(22) Filed: Jan. 21, 2015

(65) Prior Publication Data

US 2016/0211345 A1    Jul. 21, 2016

(51) Int. Cl.
*H01L 29/00*    (2006.01)
*H01L 29/66*    (2006.01)
*H01L 21/306*   (2006.01)
*H01L 29/73*    (2006.01)
*H01L 29/08*    (2006.01)

(52) U.S. Cl.
CPC ....... *H01L 29/66234* (2013.01); *H01L 21/306* (2013.01); *H01L 29/0804* (2013.01); *H01L 29/73* (2013.01)

(58) Field of Classification Search
CPC .. H01L 27/082; H01L 27/083; H01L 29/0804; H01L 29/0813; H01L 29/0826; H01L 29/66234; H01L 29/66303; H01L 29/66333; H01L 29/6634; H01L 29/73; H01L 29/732; H01L 29/737; H01L 29/7371

USPC ........................................................ 257/579
See application file for complete search history.

(56) References Cited

U.S. PATENT DOCUMENTS

| | | | |
|---|---|---|---|
| 5,789,301 A | 8/1998 | Hill | |
| 6,232,638 B1* | 5/2001 | Suzuki | ............... H01L 21/8249 257/370 |
| 6,577,200 B2 | 6/2003 | Moriwaki | |
| 8,227,832 B2 | 7/2012 | Chiu et al. | |
| 8,624,303 B2 | 1/2014 | Fujikawa | |
| 8,710,500 B2 | 4/2014 | Chan et al. | |

(Continued)

OTHER PUBLICATIONS

"Self-heating effects in a BiCMOS on SOI technology for RFIC applications" Malm, B.G.; Haralson, E.; Johansson, T.; Östling, M. Electron Devices, IEEE Transactions on vol. 52, Issue: 7, Publication Year: 2005, pp. 1423-1428 DOI: 10.1109/TED.2005.850634.

(Continued)

*Primary Examiner* — Kenneth Parker
*Assistant Examiner* — John Lin
(74) *Attorney, Agent, or Firm* — Thompson Hine LLP; Anthony Canale

(57) ABSTRACT

Device structures for a bipolar junction transistor and methods of fabricating a device structure for a bipolar junction transistor. A first semiconductor layer is formed on a substrate, and a second semiconductor layer is formed on the first semiconductor layer. The first semiconductor layer, the second semiconductor layer, and the substrate are etched to define first and second emitter fingers from the second semiconductor layer and trenches in the substrate that are laterally positioned between the first and second emitter fingers. The first semiconductor layer may function as a base layer in the device structure.

8 Claims, 8 Drawing Sheets

(56) References Cited

U.S. PATENT DOCUMENTS

2011/0147793 A1* 6/2011 Chiu .................. H01L 29/0692
                                                                           257/156
2013/0119508 A1    5/2013  Camillo-Castillo et al.
2014/0077256 A1    3/2014  Hikasa

OTHER PUBLICATIONS

Deborah A. Alperstein et al, U.S. Appl. No. 14/451,716, filed Aug. 5, 2014 entitled Self-Aligned Emitter-Base Bipolar Junction Transistor With Reduced Base Resistance and Base-Collector Capacitance.

* cited by examiner

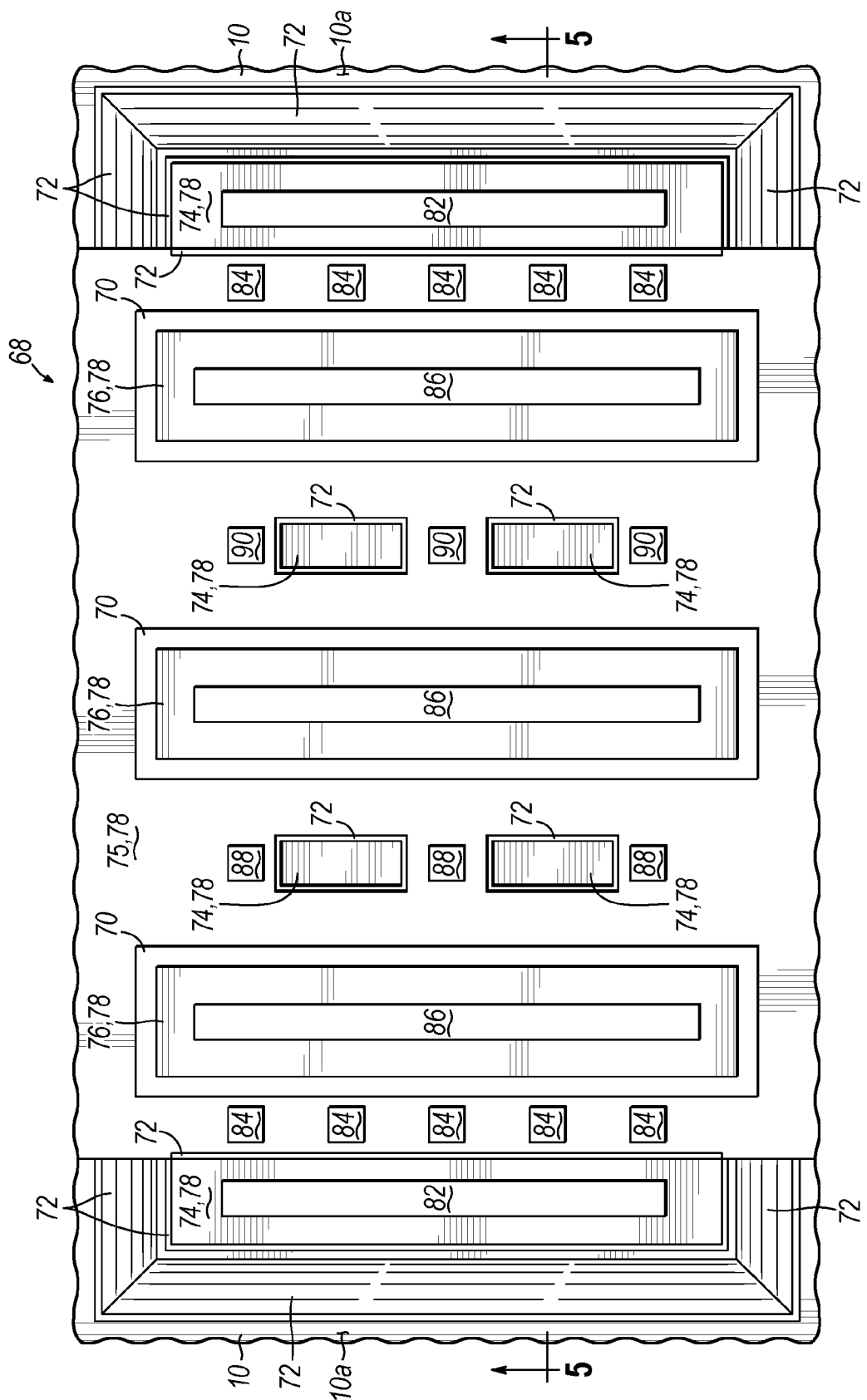

BIPOLAR JUNCTION TRANSISTOR WITH MULTIPLE EMITTER FINGERS

BACKGROUND

The invention relates generally to semiconductor devices and integrated circuit fabrication and, in particular, to fabrication methods and device structures for a bipolar junction transistor.

Bipolar junction transistors may be found, among other end uses, in high-frequency and high-power applications. In particular, bipolar junction transistors may find use in power amplifiers for wireless communications systems and in mobile devices. Bipolar junction transistors may also be used in high-speed logic circuits. Bipolar junction transistors are three-terminal electronic devices that include semiconductor regions defining an emitter, an intrinsic base, and a collector. An NPN bipolar junction transistor includes n-type semiconductor material regions constituting the emitter and collector, and a region of p-type semiconductor material constituting the intrinsic base situated between the n-type semiconductor material regions. By contrast, a PNP bipolar junction transistor includes p-type semiconductor material regions of constituting the emitter and collector, and a region of n-type semiconductor material constituting the intrinsic base situated between the p-type semiconductor material regions. The emitter, intrinsic base, and collector define a collector-base junction and an emitter-base junction across which the conductivity type of the respective semiconductor materials changes. A voltage applied across the emitter-base junction controls the movement of charge carriers that produces charge flow between the collector and emitter.

Improved fabrication methods and device structures are needed for a bipolar junction transistor.

SUMMARY

In an embodiment of the invention, a method is provided for fabricating a device structure for a bipolar junction transistor. The method includes forming a first semiconductor layer on a substrate, and forming a second semiconductor layer on the first semiconductor layer. The method includes etching the first semiconductor layer, the second semiconductor layer, and the substrate to define a first emitter finger and a second emitter finger from the second semiconductor layer and a plurality of trenches in the substrate that are laterally positioned between the first emitter finger and the second emitter finger.

In an embodiment of the invention, a device structure is provided for a bipolar junction transistor. The device structure includes a base layer on a substrate, a first emitter finger and a second emitter finger on the base layer, and a plurality of trenches in the substrate. The first trenches are laterally positioned between the first emitter finger and the second emitter finger.

BRIEF DESCRIPTION OF THE SEVERAL VIEWS OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

FIG. 5A is a top view of the substrate portion of FIG. 5.

DETAILED DESCRIPTION

Figure 1:
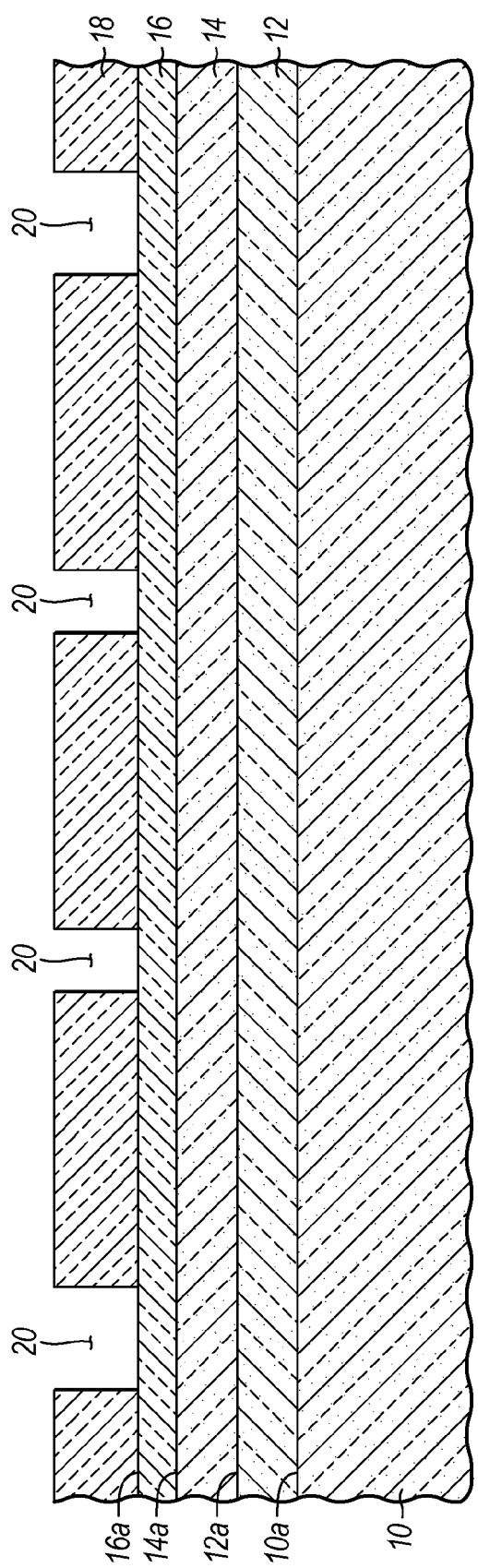
FIG. 1 is a cross-sectional view of a portion of a substrate at an initial fabrication stage of a processing method for fabricating a device structure in accordance with an embodiment of the invention.

With reference to FIG. 1 and in accordance with an embodiment of the invention, a substrate 10 comprises a single-crystal semiconductor material usable to form the devices of an integrated circuit. The semiconductor material constituting the substrate 10 may include an epitaxial layer at its surface, which may be doped with an electrically-active dopant to alter its electrical properties. For example, the substrate 10 may include an epitaxial layer of single crystal silicon that is epitaxially deposited or grown by chemical vapor deposition (CVD) and that is doped with a concentration of an n-type dopant from Group V of the Periodic Table (e.g., phosphorus (P), arsenic (As), or antimony (Sb)) in a concentration that is effective to impart n-type conductivity. Isolation regions, such as shallow trench isolation regions, may be used to isolate the portion of the substrate 10 used to fabricate the device structure.

A base layer 12 is formed as an additive film on a top surface 10a of substrate 10. The base layer 12 may be comprised of a semiconductor material, such as silicon-germanium (SiGe) in an alloy with a content of silicon (Si) ranging from 95 atomic percent to 50 atomic percent and a content of germanium (Ge) ranging from 5 atomic percent to 50 atomic percent. The germanium content of the base layer 12 may be uniform across the thickness of base layer 12, or graded and/or stepped across the thickness of base layer 12. If the germanium content is stepped, respective thicknesses of the base layer 12 that are directly adjacent to the substrate 10 and directly adjacent to the top surface 12a may lack a germanium content and may therefore constitute intrinsic layers comprised entirely of silicon. The base layer 12 may comprise a dopant, such as a p-type dopant selected from Group III of the Periodic Table (e.g., boron) in a concentration that is effective to impart p-type conductivity to the semiconductor material of the base layer and, optionally, carbon (C) to suppress the mobility of the p-type dopant.

The base layer 12 may be formed using a low temperature epitaxial (LTE) growth process, such as vapor phase epitaxy (VPE) conducted at a growth temperature ranging from 400° C. to 850° C. Single crystal semiconductor material (e.g., single crystal silicon and/or single crystal SiGe) is epitaxially grown or deposited by the LTE growth process on the top surface 10a of substrate 10. The base layer 12 may have an epitaxial relationship with the single crystal semiconductor material of the substrate 10 in which the crystal structure and orientation of the substrate 10 operates as a template to establish the crystal structure and orientation of the base layer 12 during growth.

An emitter layer 14 is formed as an additive film on a top surface 12a of the base layer 12. The emitter layer 14 may be comprised of a different semiconductor material than base layer 12 and may have an opposite conductivity type from the base layer 12. For example, the emitter layer 14 may lack germanium that is present in at least a portion of the base layer 12. In a representative embodiment, the semiconductor material comprising the emitter layer 14 may be polysilicon (i.e. polycrystalline silicon) deposited by CVD, and may contain an n-type dopant in a concentration effective to impart n-type conductivity.

A hardmask layer 16 is formed on a top surface 14a of the emitter layer 14. In a representative embodiment, the hardmask layer 16 may be comprised of one or more layers of materials, such as a layer of silicon nitride ($Si_3N_4$) and a thinner layer of $SiO_2$ between the $Si_3N_4$ layer and the top surface 14a of the emitter layer 14. The layer(s) constituting the hardmask layer 16, which may be formed by wet or dry thermal oxidation, CVD, or a combination of these processes, may be selected to etch selectively to the semiconductor material of the emitter layer 14 and to be readily removed at a subsequent fabrication stage.

A mask layer 18 may be applied on a top surface 16a of the hardmask layer 16 and patterned with photolithography to pattern the hardmask layer 16. Specifically, openings 20 are defined in the hardmask layer 16 at the intended locations of trenches to be subsequently formed. To that end, the mask layer 18 may comprise a light-sensitive material, such as a photoresist, that is applied as a coating by a spin coating process, pre-baked, exposed to light projected through a photomask, baked after exposure, and developed with a chemical developer to form an etch mask.

Figure 2:
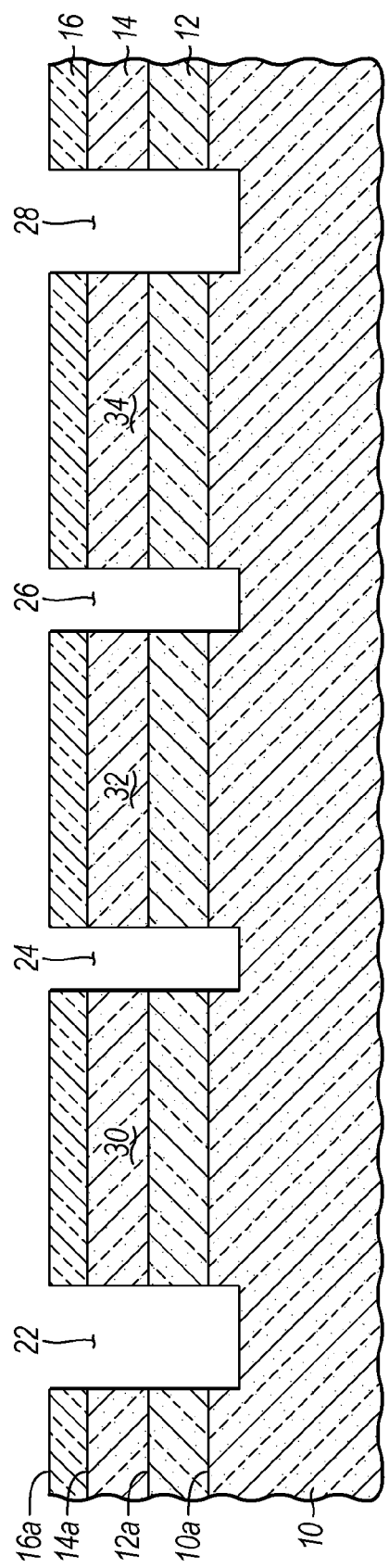
FIG. 2 is a cross-sectional view of the substrate portion of FIG. 1 at a subsequent fabrication stage of the processing method.
Figure 2A:
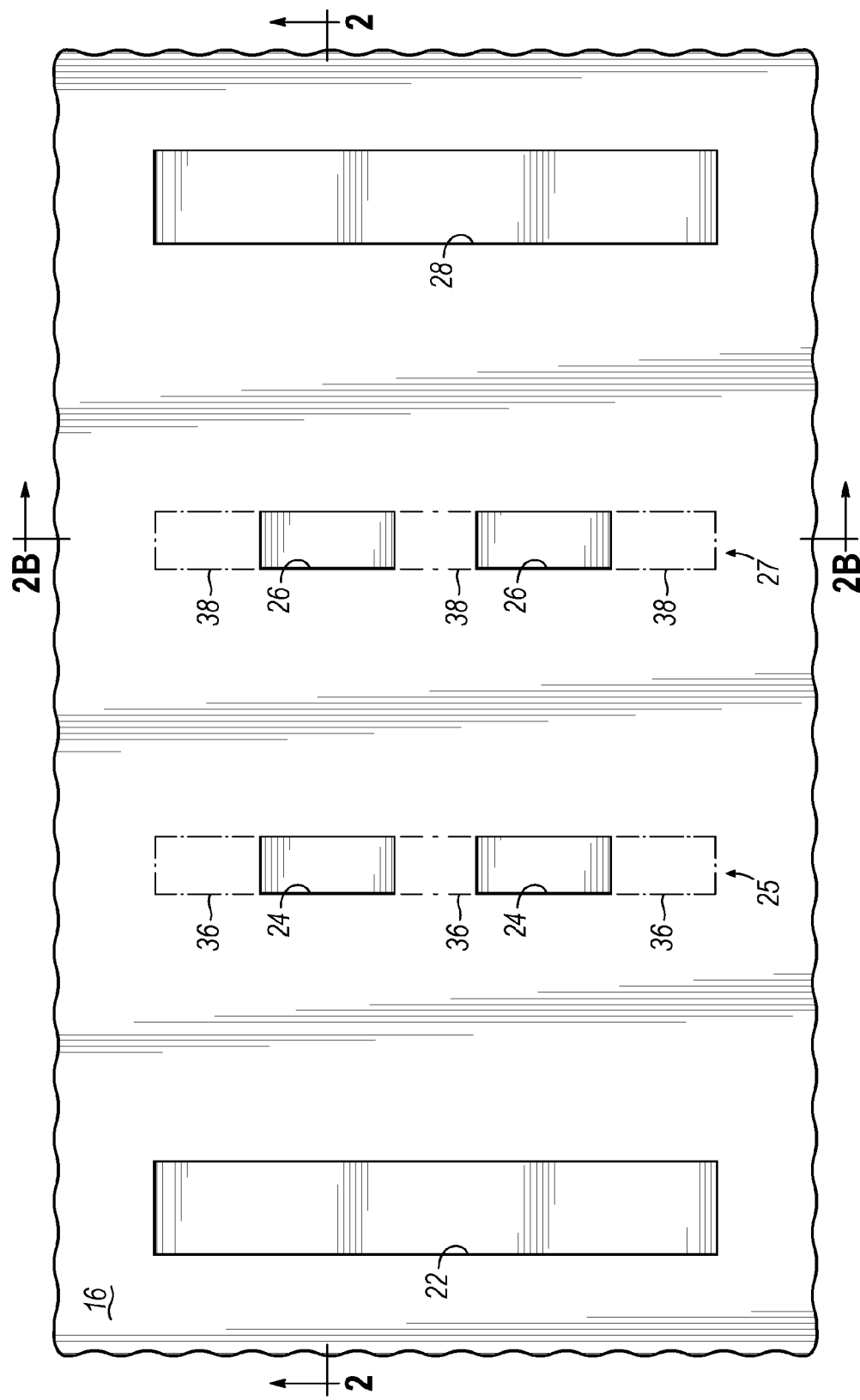
FIG. 2A is a top view of the substrate portion of FIG. 1.
Figure 2B:
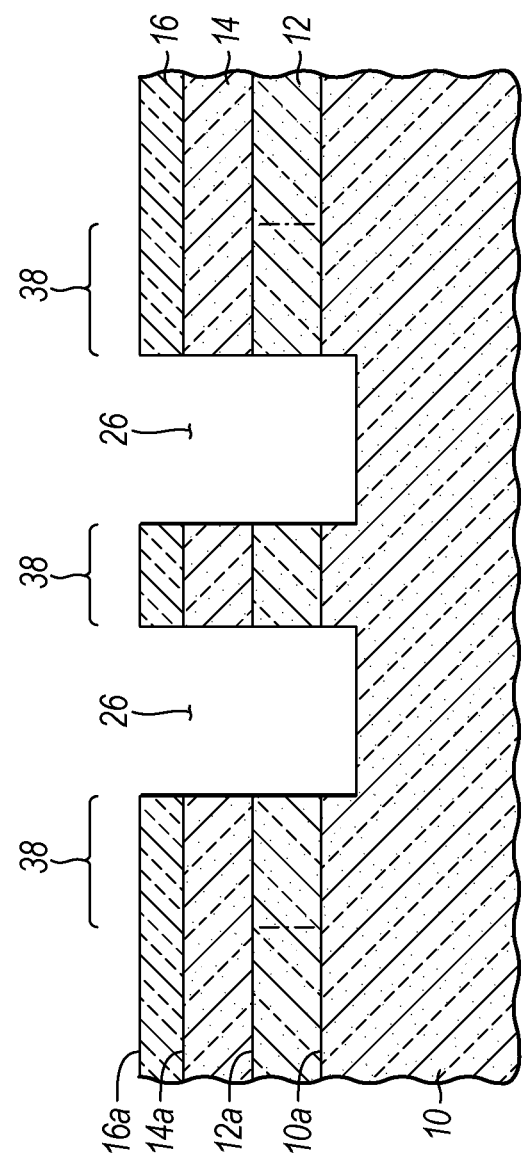
FIG. 2B is a cross-sectional view taken generally along line 2B-2B in FIG. 2A.

With reference to FIGS. 2, 2A, 2B in which like reference numerals refer to like features in FIG. 1 and at a subsequent fabrication stage of the processing method, an etching process is used, with mask layer 18 present on the top surface 16a of the hardmask layer 16 as an etch mask, to form trenches 22, 24, 26, 28 at the locations of the openings 20. The trenches 22, 24, 26, 28 include sidewalls that extend through the layers 12, 14, 16 and to a shallow depth into the substrate 10 relative to the top surface 10a. The etching process may comprise a wet chemical etching process or a dry etching process, such as reactive-ion etching (RIE). The etching process, which may be conducted in a single etching step or multiple steps, relies on one or more etch chemistries and is non-selective to the semiconductor materials of the layers 12, 14 and substrate 10 such that the different semiconductor materials etch with the same etch rate. The mask layer 18 may be removed after the trenches 22, 24, 26, 28 are formed by the etching process. If comprised of a photoresist, the mask layer 18 may be removed by ashing or solvent stripping, followed by a conventional cleaning process.

The trenches 22, 28 are each continuous along their respective lengths so that each comprises a single channel, and are used in a subsequent processing to form collector contact regions. The trenches 24 are arranged with an alignment in a row 25 and portions of layers 12, 14, 16 and substrate 10 interrupt the continuity of the row 25. Similarly, the trenches 26 are arranged with an alignment in a row 27, and portions of layers 12, 14, 16 and substrate 10 interrupt the continuity of the row 27. The row 25 including trenches 24 is aligned parallel with the row 27 including trenches 26. The trenches 24 and the trenches 26 are positioned laterally between trench 22 and trench 28, and the trenches 24 in row 25 and the trenches 26 in row 27 are aligned parallel with trenches 22, 28. The trenches 22, 28 may be wider than trenches 24, 26.

The trenches 22, 24, 26, 28 divide the emitter layer 14 into sections to form emitter fingers 30, 32, 34 of the device structure. In an alternative embodiment, the device structure may be provided with additional emitter fingers and additional trenches like trenches 24 or trenches 26 may be formed between these additional emitter fingers. The trenches 22, 24, 26, 28 are aligned parallel to the emitter fingers 30, 32, 34. In an embodiment, the longest dimension of the trenches 22, 24, 26, 28 is aligned parallel to the longest dimension of the emitter fingers 30, 32, 34.

Sections 36 of the base layer 12 laterally between emitter finger 30 and emitter finger 32 remain after the etching process forming trenches 22, 24, 26, 28 that penetrate through the base layer 12. Specifically, the sections 36 are located between the trenches 24 in row 25 and adjacent to the trenches 24 located at the ends of the row 25. The sections 36 of the base layer 12 define bridges between each adjacent pair of trenches 24 that are later used in a subsequent processing step to provide landing areas for contacts that land on the base layer 12 between emitter fingers 30, 32.

Similarly, sections 38 of the base layer 12 laterally between emitter finger 32 and emitter finger 34 remain after the etching process forming trenches 22, 24, 26, 28. Specifically, the sections 38 are located between the trenches 26 in row 27 and adjacent to the trenches 26 located at the ends of the row 27. The sections 38 of the base layer 12 define bridges between the adjacent pairs of trenches 26 that are later used in a subsequent processing step to provide landing areas for contacts that land on the base layer 12 between emitter fingers 32, 34.

Figure 3:
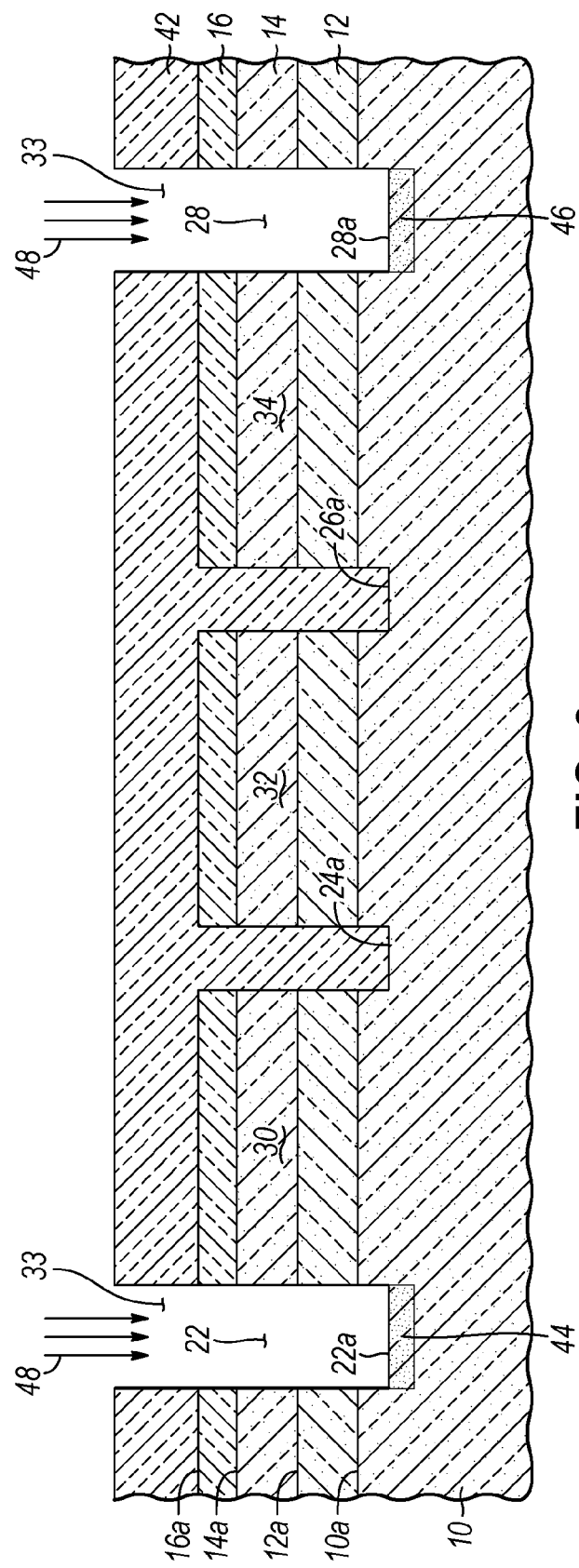
FIGS. 3-5 are cross-sectional views of the substrate portion at successive fabrication stages subsequent to FIG. 2.

With reference to FIG. 3 in which like reference numerals refer to like features in FIGS. 2, 2A, 2B and at a subsequent fabrication stage of the processing method, a mask layer 42 may be applied on a top surface 16a of the hardmask layer 16 and patterned with photolithography to define openings 33 that are registered with trenches 22, 28. To that end, the mask layer 42 may comprise a light-sensitive material, such as a photoresist, that is applied as a coating by a spin coating process, pre-baked, exposed to light projected through a photomask, baked after exposure, and developed with a chemical developer to form an implantation mask. The mask layer 42 covers and/or occupies the trenches 24, 26.

Doped regions 44, 46 may be formed in respective sections of the substrate 10 at the respective bottom surfaces 22a, 28a of each of the trenches 22, 28 by introducing a dopant into the semiconductor material of the substrate. In one embodiment, the doped regions 44, 46 may be formed by implanting ions 48 comprising an n-type dopant with implantation conditions (e.g., kinetic energy and dose) effective to place the dopant across a shallow depth in the substrate 10 relative to the respective bottom surfaces 22a, 28a of the trenches 22, 28 and over a portion of each of the bottom surfaces 22a, 28a. Less than the entirety of the surface areas of the bottom surfaces 22a, 28a is implanted with ions 48 to form the doped regions 44, 46. The mask layer 42 and/or hardmask layer 16 block the implanted ions 48 from reaching the emitter layer 14 or the substrate 10 at the respective bottom surfaces 24a, 26a of the trenches 24, 26. The implantation damage to the semiconductor material of the substrate 10 and/or doping of the semiconductor material of the substrate 10 may alter the etch rate in the doped regions 44, 46 relative to the surrounding semiconductor material of the substrate 10. In an embodiment, the effect of the implantation with ions 48 may be to lower the etch rate in the doped regions 44, 46 relative to the surrounding semiconductor material of the substrate 10.

The mask layer 42 may be removed following the implantation of ions 48. If comprised of a photoresist, the mask layer 42 may be removed by ashing or solvent stripping, followed by a conventional cleaning process.

Figure 4:
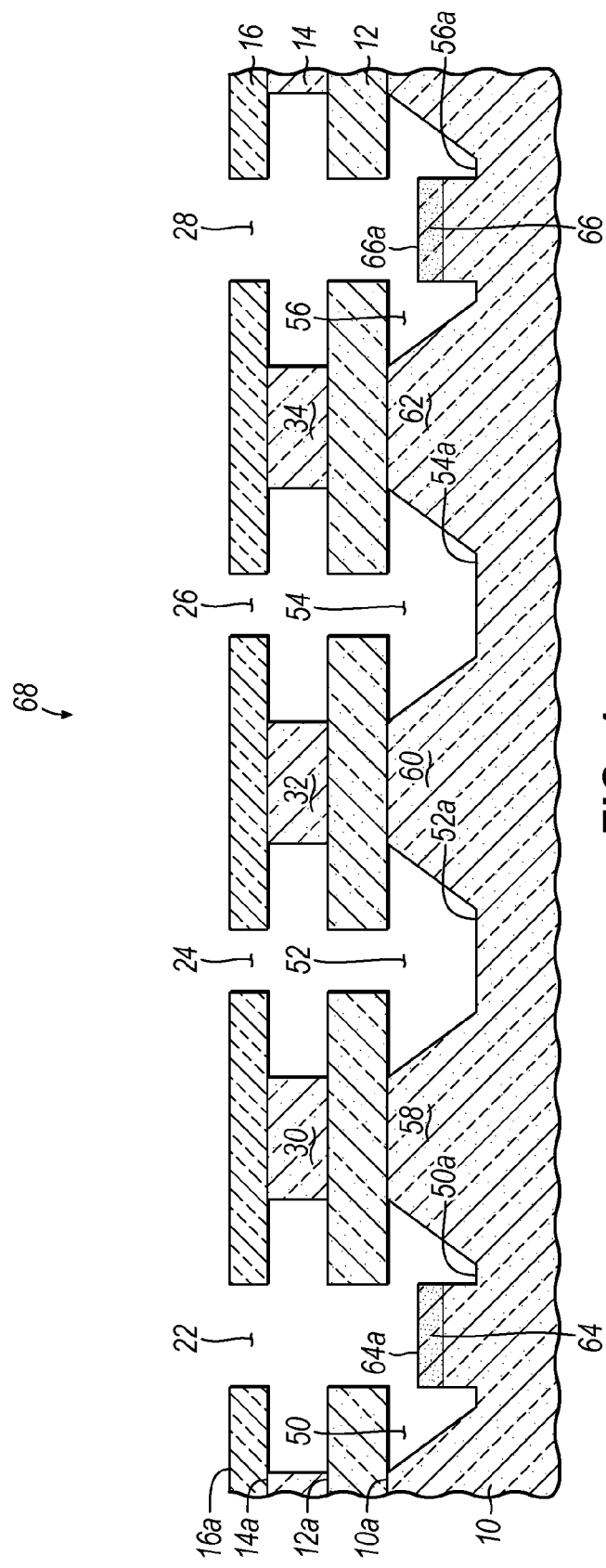

With reference to FIG. 4 in which like reference numerals refer to like features in FIG. 3 and at a subsequent fabrication stage of the processing method, trenches 50, 52, 54, 56 are formed in substrate 10 and undercut the base layer 12 at different locations. The trenches 50, 52, 54, 56 may be formed by increasing the dimensions (e.g., depth and width) of the portion of trenches 22, 24, 26, 28 in the substrate 10 with an etching process that etches the substrate 10 selective to the material of the base layer 12 and the material of the hardmask layer 16. The etch selectivity of the process forming trenches 50, 52, 54, 56, which differs from non-selective etch process used to form trenches 22, 24, 26, 28, may originate from the use of a composition-sensitive etchant that etches the semiconductor material of the substrate 10 at a greater etch rate than the semiconductor material of the base layer 12 and the semiconductor material of the substrate 10 at a greater etch rate than the semiconductor material of the sections of the emitter layer 14 comprising emitter fingers 30, 32, 34. The trenches 52 are now aligned in the row 25 and the trenches 54 are now aligned in the row 27.

The etching process may comprise a wet chemical etching process, a dry etching process, or a combination of wet chemical and dry etching processes. The etching process may be controlled by selecting factors such as the etchant chemistry, duration, etc. Each etching process may be combined with implantation damage to the semiconductor material and/or impurity-doping of the semiconductor material to alter etch rates and, thereby, the profile of the trenches 50, 52, 54, 56. The etching process may further rely on wafer orientation and anisotropic etching processes that exhibit different etch rates for different crystallographic directions (as specified, for example, by Miller indices) in a single-crystal semiconductor material. In one embodiment, the vertical and lateral etch rates may be identical when the trenches 50, 52, 54, 56 are formed. The hardmask layer 16 may be removed after the emitter fingers 30, 32, 34 are narrowed and the trenches 50, 52, 54, 56 are formed.

A collector pedestal 58 of a collector is defined by a portion of the substrate 10 that is laterally positioned between the trenches 50, 52 so that the trenches 50, 52 are laterally separated by the collector pedestal 58. A collector pedestal 60 of a collector is defined by a portion of the substrate 10 that is laterally positioned between the trenches 52, 54 so that the trenches 52, 54 are laterally separated by the collector pedestal 60. A collector pedestal 62 of a collector is defined by a portion of the substrate 10 that is laterally positioned between the trenches 54, 56 so that the trenches 54, 56 are laterally separated by the collector pedestal 62. The collector pedestals 58, 60, 62 are comprised of respective portions of the semiconductor material of the substrate 10 and collective define the collector of the device structure. The collector pedestals 58, 60, 62 may be selectively implanted with a dopant to further enhance its electrical conductivity. In one embodiment, the collector pedestals 58, 60, 62 may comprise portions of n-type semiconductor material of an epitaxial layer of the substrate 10 and may be optionally implanted with an n-type dopant to enhance electrical conductivity.

The emitter fingers 30, 32, 34 are also narrowed and defined when the trenches 50, 52, 54, 56 are formed in substrate 10 because each corresponding section of the emitter layer 14 is also undercut laterally in a plane relative to the hardmask layer 16. The portion of the base layer 12 covered by the emitter finger 30 may define an intrinsic base that forms a junction with the emitter finger 30, and that forms another junction with the collector pedestal 58. The portion of the base layer 12 covered by the emitter finger 32 may define an intrinsic base that forms a junction with the emitter finger 32, and that forms another junction with the collector pedestal 60. The portion of the base layer 12 covered by the emitter finger 34 may define an intrinsic base that forms a junction with the emitter finger 34, and that forms another junction with the collector pedestal 60. Portions of the base layer 12 that are not covered by the emitter fingers 30, 32, 34 may be doped (e.g., by ion implantation) to define an extrinsic base with enhanced electrical conductivity after dopant activation.

The doped semiconductor material in the doped regions 44, 46 may also have an etch rate that is less than the etch rate for the surrounding semiconductor material of the substrate 10 when the trenches 50 and 56 are formed in substrate 10. The result of the slowed etch rate is that contact regions 64, 66 may be respectively formed as ridges inside the trenches 50, 56. The contact regions 64, 66 may extend along almost the entire length of the trenches 50, 56 with gaps at the opposite ends and along the sidewalls that are filled with dielectric material. The contact region 64 may have a top surface 64a that is raised or elevated above the base 50a of the trench 50 by a distance, d. Similarly, the contact region 66 may have a top surface 66a that is raised or elevated above the base 56a of the trench 56. The top surfaces 64a, 66a are also raised or elevated by the same distance, d, (or by a different distance than distance, d) above the respective bases 52a, 54a of trenches 52, 54.

The resulting device structure is a bipolar junction transistor 68 that includes the emitter fingers 30, 32, 34, the collector formed by the collector pedestals 58, 60, 62, and the portion of the base layer 12 (i.e., intrinsic base) that is vertically between the emitter fingers 30, 32, 34 and collector pedestals 58, 60, 62 comprising a collector. The collector pedestals 58, 60, 62 are coextensive with one surface of the intrinsic base of the base layer 12 along a junction. The emitter fingers 30, 32, 34 are coextensive with an opposite surface of the intrinsic base of the base layer 12 along another junction. The bipolar junction transistor 68 may be characterized as a heterojunction bipolar transistor (HBT) if two or all three of the emitter fingers 30, 32, 34, the collector formed by the collector pedestals 58, 60, 62, and the base layer 12 are comprised of different semiconductor materials.

During the front-end-of-line (FEOL) portion of the fabrication process, the device structure of the bipolar junction transistor 68 is replicated across at least a portion of the surface area of the substrate 10. In BiCMOS integrated circuits, complementary metal-oxide-semiconductor (CMOS) transistors may be formed using other regions of the substrate 10. As a result, both bipolar and CMOS transistors may be available on the same substrate 10.

Figure 5:
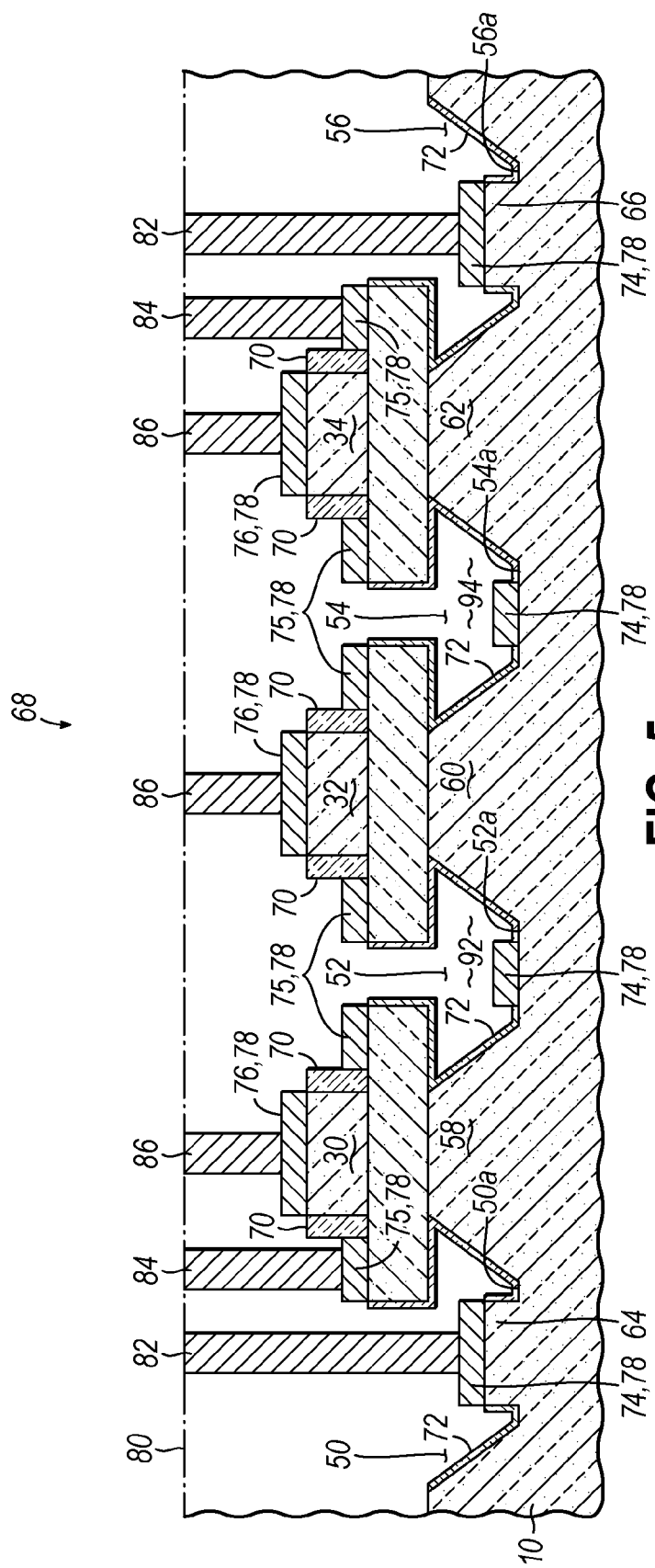

With reference to FIGS. 5, 5A in which like reference numerals refer to like features in FIG. 4 and at a subsequent fabrication stage of the processing method, spacers 70 may be formed on the vertical sidewalls of the emitter fingers 30, 32, 34 by etching one or more dielectric layers (e.g., silicon dioxide ($SiO_2$) or silicon nitride ($Si_3N_4$)) with an anisotropic etching process. The anisotropic etching process, which may be conducted in a single etching step or multiple steps, may rely on one or more RIE etch chemistries.

A dielectric layer 72 is formed as a passivation coating on the surfaces bounding the trenches 50, 52, 54, 56, on the top surface of the emitter fingers 30, 32, 34, and on the surfaces of the base layer 12 not covered by the emitter fingers 30, 32, 34 and their spacers 70. The dielectric layer 72 may be comprised of an electrical insulator with a dielectric constant (e.g., permittivity) characteristic of a dielectric material. In one embodiment, the dielectric layer 72 may be comprised of a low temperature oxide deposited using CVD. A directional anisotropic etching process, such as RIE, may be used to preferentially remove the electrical insulator of dielectric layer 72 from horizontal surfaces of the contact regions 64, 66, base layer 12, and emitter fingers 30, 32, 34.

Sections 74 of a silicide layer 78 are formed on the horizontal surfaces of the contact regions 64, 66 that are not covered by the dielectric layer 72 after etching, and may be subsequently used in the process flow to contact the collector formed by the collector pedestals 58, 60, 62. Sections 75 of the silicide layer 78 are formed on the top surface of the base layer 12 not covered by the emitter fingers 30, 32, 34 and their spacers 70, and may be subsequently used in the process flow to contact the extrinsic base and thereby the intrinsic base. Sections 76 of the silicide layer may be formed on the top surface of the emitter fingers 30, 32, 34, and may be subsequently used in the process flow to contact the emitter fingers 30, 32, 34. The silicide layer is not formed on surfaces that are covered by the dielectric layer 72 and spacers 70.

The silicide layer 78 may be formed by a silicidation process that involves one or more annealing steps to form a silicide phase by reacting a layer of silicide-forming metal and the semiconductor material contacting the silicide-forming metal. Candidate refractory metals for the silicide-forming metal include, but are not limited to, titanium (Ti), cobalt (Co), or nickel (Ni). The silicide-forming metal may be deposited by, for example, a CVD process or a physical vapor deposition (PVD) process. A capping layer comprised of a metal nitride, such as sputter-deposited titanium nitride (TiN), may be applied to cap the silicide-forming metal. An initial annealing step of the silicidation process may form a metal-rich silicide that consumes the silicide-forming metal and then form silicides of lower metal content that grow by consuming the metal-rich silicides. Following the initial annealing step, any remaining silicide-forming metal and the optional capping layer may be removed by wet chemical etching. The silicide layer 78 may then be subjected to an additional annealing step at a higher temperature to form a lower-resistance silicide phase.

Standard middle-end-of-line (MEOL) processing and back-end-of-line (BEOL) processing follows, which includes formation of dielectric layers, via plugs, and wiring for an interconnect structure coupled by the local interconnect structure with the bipolar junction transistor 68, as well as other similar contacts for additional device structures like bipolar junction transistor 68 and CMOS transistors included in other circuitry fabricated on the substrate 10.

The MEOL processing, which includes formation of a dielectric layer 80, contacts 82, 84, 86, 88, 90, and wiring, follows to define a local interconnect structure. Candidate inorganic dielectric materials for the dielectric layer 80 may include, but are not limited to, borophosphosilicate glass (BPSG), silicon dioxide ($SiO_2$), silicon nitride ($Si_3N_4$), fluorine-doped silicon glass (FSG), and combinations of these and other dielectric materials. Dielectric layer 80 may be deposited by any number of techniques, such as sputtering, spin-on application, or CVD.

Portions of the dielectric layer 80 may fill the trenches 50, 52, 54, 56. In particular, the portions of the dielectric layer 80 filling the trenches 52 may define isolation regions 92 between the emitter fingers 30 and 32, and the portions of the dielectric layer 80 filling the trenches 54 may define isolation regions 94 between the emitter fingers 32 and 34.

Contacts 82 extend through the dielectric layer 80 to contact the sections 74 of silicide layer 78 and, thereby, to be coupled with the contact regions 64, 66 for the collector. Contacts 84 extend through the dielectric layer 80 to contact the sections 75 of silicide layer 78 and, thereby, to be coupled with the base layer 12 (i.e., the extrinsic base and the intrinsic base) at discrete locations between the emitter finger 30 and the contact region 64 for the collector and at discrete locations between the emitter finger 34 and the contact region 66 for the collector. Contacts 86 extend through the dielectric layer 80 to contact the sections 76 of silicide layer 78 and, thereby, to be coupled with the emitter fingers 30, 32, 34.

Contacts 88 extend through the dielectric layer 80 to contact the sections 76 of silicide layer and, thereby, to be coupled with the base layer 12 (i.e., the extrinsic base and the intrinsic base) at discrete locations between the emitter fingers 30, 32. The discrete locations for the contacts 88 are positions on the sections 36 of the base layer 12, now covered by sections 76 of the silicide layer 78, between the emitter fingers 30, 32 in a first lateral direction. The contacts 88 are aligned in the row 25 that includes the trenches 52, now filled with dielectric material to form the isolation regions 92 in a second lateral direction transverse to the first lateral direction.

Contacts 90 extend through the dielectric layer 80 to contact the sections 76 of silicide layer and, thereby, to be coupled with the base layer 12 (i.e., the extrinsic base and the intrinsic base) at discrete locations between the emitter fingers 32, 34. The discrete locations for the contacts 90 are positions on the sections 38 of the base layer 12, now covered by sections 76 of the silicide layer 78, between the emitter fingers 32, 34 in a first lateral direction. The contacts 90 are aligned in the row 27 that includes the trenches 54, now filled with dielectric material to form the isolation regions 94 in a second lateral direction that is transverse to the first lateral direction.

The sections 76 of the silicide layer 78 inside of the trenches 52, 54 are not contacted. Instead, the sections 76 of the silicide layer 78 are buried in the insulating material of the dielectric layer 80.

The bipolar junction transistor 68 may exhibit improved device performance as measured by figures of merit such as the cut-off frequency $f_T$ and the maximum oscillation frequency $f_{max}$. The trenches 50, 52, 54, 56 function to reduce the volume of the collector, which may be effective to reduce the collector-to-base parasitic capacitance (Ccb) and thereby improve device efficiency. The reduction in the collector-to-base parasitic capacitance may be provided without causing a significant reduction in the base resistance (Rb). The trenches 52 function operate to deepen the collector at selected locations between emitter fingers 30, 32 and the trenches 54 function operate to deepen the collector at selected locations between emitter fingers 32, 34.

The plane containing the top surfaces 64a, 66a of the contact regions 64, 66 for the collector is raised or elevated by the distance, d, above the planes containing the respective bases 52a, 54a of trenches 52, 54. As a result, the collector contact area in the plane of the top surfaces 64a, 66a is at a shallower depth relative to the top surface 10a of the substrate 10 than the bases 52a, 54a of trenches 52, 54.

The sections 36 of the base layer 12 define bridges that provide landing areas for contacts 88 laterally between the emitter fingers 30, 32 and aligned in the row 25 that includes the trenches 52, now isolation regions 92. The sections interrupt the continuity of the isolation regions 92 so that surface area is available on the base layer 12 between the emitter fingers 30, 32 for contacts 88, which are shared by the portions of the base layer 12 associated with the different emitter fingers 30, 32.

The sections 38 of the base layer 12 define bridges that provide landing areas for contacts 90 laterally between the emitter fingers 32, 34 and aligned in the row 27 that includes the trenches 54, now isolation regions 94. The sections interrupt the continuity of the isolation regions 94 so that surface area is available on the base layer 12 between the emitter fingers 32, 34 for contacts 90, which are shared by the portions of the base layer 12 associated with the different emitter fingers 32, 34.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

A feature may be "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A device structure for a bipolar junction transistor formed using a substrate, the device structure comprising:
    a base layer on the substrate;
    a first emitter finger and a second emitter finger on the base layer; and
    a plurality of first trenches in the substrate, the plurality of first trenches laterally positioned between the first emitter finger and the second emitter finger,
    wherein the plurality of first trenches are arranged in a row parallel to the first emitter finger and parallel to the second emitter finger, and the base layer includes a section that is positioned between an adjacent pair of the plurality of first trenches in the row.

2. The device structure of claim 1 wherein the plurality of first trenches are filled with dielectric material to define a plurality of isolation regions.

3. The device structure of claim 1 further comprising:
    a second trench in the substrate that is laterally separated from the plurality of first trenches in the substrate by a portion of the substrate defining a collector pedestal.

4. The device structure of claim 3 further comprising:
    a contact region in the second trench, the contact region raised relative to respective bases of the plurality of first trenches and relative to a bottom surface of the second trench adjacent to the contact region.

5. The device structure of claim 4 further comprising:
    a contact coupled with the contact region in the second trench,
    wherein the contact region couples the contact in electrical contact with the collector pedestal.

6. The device structure of claim 1 further comprising:
    a contact coupled with the section of the base layer.

7. The device structure of claim 1 further comprising:
    a second trench in the substrate that is laterally separated from the plurality of first trenches in the substrate by a portion of the substrate defining a collector pedestal,
    wherein the row including the plurality of first trenches and the second trench are aligned parallel to the first emitter finger and the second emitter finger.

8. The device structure of claim 1 wherein the plurality of first trenches extend through the base layer to define the section of the base layer.

* * * * *